US011552601B2

(12) United States Patent
Yanagihara et al.

(10) Patent No.: US 11,552,601 B2
(45) Date of Patent: Jan. 10, 2023

(54) POWER AMPLIFIER CIRCUIT

(71) Applicant: Murata Manufacturing Co., Ltd., Kyoto (JP)

(72) Inventors: Shingo Yanagihara, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 159 days.

(21) Appl. No.: 17/099,297

(22) Filed: Nov. 16, 2020

(65) Prior Publication Data
US 2021/0152139 A1 May 20, 2021

(30) Foreign Application Priority Data

Nov. 20, 2019 (JP) .............................. JP2019-209365

(51) Int. Cl.
H03F 3/21 (2006.01)
H03F 1/02 (2006.01)
H03F 1/56 (2006.01)

(52) U.S. Cl.
CPC ............ H03F 3/211 (2013.01); H03F 1/0211 (2013.01); H03F 1/565 (2013.01); *H03F 2200/222* (2013.01); *H03F 2200/318* (2013.01); *H03F 2200/387* (2013.01); *H03F 2200/451* (2013.01)

(58) Field of Classification Search
CPC ...................................................... H03F 3/211
See application file for complete search history.

(56) References Cited

U.S. PATENT DOCUMENTS

| 4,241,316 A * | 12/1980 | Knapp .................... H03F 3/165 330/277 |
| 6,137,367 A * | 10/2000 | Ezzedine ................ H03F 3/193 330/311 |
| 10,135,395 B2 | 11/2018 | Tanaka et al. |
| 10,389,307 B2 | 8/2019 | Tanaka et al. |
| 2003/0048138 A1* | 3/2003 | Van De Westerlo ... H03F 1/523 330/311 |
| 2004/0212434 A1* | 10/2004 | Nagamori ............ H03G 3/3042 330/285 |
| 2009/0309655 A1* | 12/2009 | Yamamoto .............. H03F 3/191 330/51 |

(Continued)

FOREIGN PATENT DOCUMENTS

| JP | 2015-115835 A | 6/2015 |
| WO | 2013/129431 A1 | 9/2013 |

*Primary Examiner* — Patricia T Nguyen
(74) *Attorney, Agent, or Firm* — Pearne & Gordon LLP

(57) ABSTRACT

A power amplifier circuit includes an input-stage power amplifier configured to receive a radio-frequency input signal, an output-stage power amplifier configured to output an amplified radio-frequency output signal, and an intermediate-stage power amplifier disposed between the input-stage power amplifier and the output-stage power amplifier. The intermediate-stage power amplifier includes a first transistor, a second transistor, and a capacitor having a first end connected to an emitter of the first transistor and a second end connected to a collector of the second transistor. The intermediate-stage power amplifier receives a signal at a base of the second transistor thereof and outputs an amplified signal from a collector of the first transistor thereof.

9 Claims, 11 Drawing Sheets

(56) References Cited

U.S. PATENT DOCUMENTS

| | | | |
|---|---|---|---|
| 2011/0316636 A1* | 12/2011 | Zhao | H03H 7/40 |
| | | | 330/310 |
| 2014/0354350 A1* | 12/2014 | Bowers | H03F 1/301 |
| | | | 327/564 |
| 2015/0171796 A1 | 6/2015 | Matsui | |
| 2020/0195210 A1 | 6/2020 | Tanaka et al. | |

* cited by examiner

FIG. 6

| GAIN[dB] | FIRST MATCHING CIRCUIT MN1 | POWER AMPLIFIER 11 | SECOND MATCHING CIRCUIT MNa | POWER AMPLIFIER 1Ma | THIRD MATCHING CIRCUIT MNb | POWER AMPLIFIER 12 | FOURTH MATCHING CIRCUIT MN2 | TOTAL |
|---|---|---|---|---|---|---|---|---|
| | -4 | 15 | -4.5 | 14 | -2.5 | 12 | -1.5 | 28.5 |

FIG. 8

| | FIRST MATCHING CIRCUIT MN1 | POWER AMPLIFIER 11 | SECOND MATCHING CIRCUIT MNa | POWER AMPLIFIER 1M | THIRD MATCHING CIRCUIT MNb | POWER AMPLIFIER 12 | FOURTH MATCHING CIRCUIT MN2 | TOTAL |
|---|---|---|---|---|---|---|---|---|
| GAIN[dB] | −4 | 15 | −4.5 | 18 | −2.5 | 12 | −1.5 | 32.5 |

POWER AMPLIFIER CIRCUIT

CROSS REFERENCE TO RELATED APPLICATION

This application claims priority from Japanese Patent Application No. 2019-209365 filed on Nov. 20, 2019. The content of this application is incorporated herein by reference in its entirety.

BACKGROUND

The present disclosure relates to a power amplifier circuit. A mobile communication terminal device such as a mobile phone or a smartphone includes a power amplifier circuit having transistors. For example, Japanese Unexamined Patent Application Publication No. 2015-115835 discloses a power amplifier circuit for use in a mobile communication terminal device, such as a mobile phone or a smartphone, and configured to amplify an input radio-frequency (RF) signal and output an amplified signal.

Some power amplifier circuits have a configuration in which a plurality of stages of power amplifiers are connected to ensure sufficient gain. For example, a power amplifier circuit has a three-stage configuration including a drive stage, an initial stage preceding the drive stage, and a power stage.

A power amplifier circuit having a plurality of stages of power amplifiers connected to each other desirably implements low-distortion power amplification. Further, the power amplifier circuit is desirably small in size.

BRIEF SUMMARY

The present disclosure implements a power amplifier circuit providing low distortion and ensuring sufficient gain without necessarily increasing the circuit size.

According to embodiments of the present disclosure, a power amplifier circuit includes an input-stage power amplifier configured to receive a radio-frequency input signal, an output-stage power amplifier configured to output an amplified radio-frequency output signal, and an intermediate-stage power amplifier disposed between the input-stage power amplifier and the output-stage power amplifier. The intermediate-stage power amplifier includes a first transistor, a second transistor, and a capacitor having a first end connected to a first terminal of the first transistor and a second end connected to a second terminal of the second transistor. The intermediate-stage power amplifier receives a signal at a third terminal of the second transistor thereof and outputs an amplified signal from a second terminal of the first transistor thereof.

According to embodiments of the present disclosure, it is possible to implement a power amplifier circuit providing low distortion and ensuring sufficient gain without necessarily increasing the circuit size.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 6 illustrates the gains of the components of the power amplifier circuit illustrated in FIG. 5;

FIG. 8 illustrates the gains of the components of the power amplifier circuit illustrated in FIG. 7;

DETAILED DESCRIPTION

The following describes power amplifier circuits according to embodiments of the present disclosure in detail with reference to the drawings. It should be noted that the present disclosure is not limited by the embodiments. Components in the embodiments include those that are replaceable and easily made by a person skilled in the art, or those that are substantially the same. The embodiments are illustrative, and components presented in different embodiments may be partially replaced or combined. Features common to a first embodiment will not be described in a second embodiment and the subsequent embodiments, and only the differences will be described. In particular, similar operations and effects achieved with similar configurations will not be described again in the individual embodiments.

First Embodiment

Circuit Configuration

Figure 1:
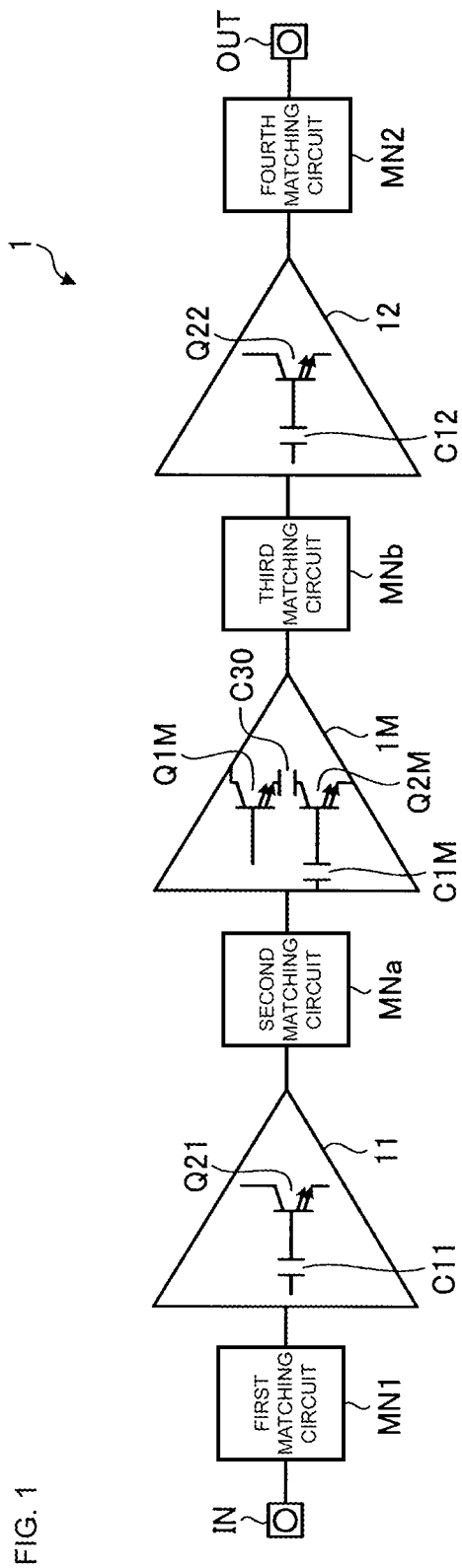
FIG. 1 is a circuit configuration of a power amplifier circuit according to a first embodiment.

FIG. 1 illustrates a circuit configuration of a power amplifier circuit 1 according to a first embodiment. In FIG. 1, the power amplifier circuit 1 includes an input terminal IN, an input-stage power amplifier 11, an intermediate-stage power amplifier 1M, an output-stage power amplifier 12, and an output terminal OUT. The input terminal IN is a terminal that receives a signal to be amplified. For example, the input terminal IN receives a radio-frequency (RF) signal. The RF signal is, for example, a signal used in mobile communication. The output terminal OUT is a terminal that outputs an amplified signal. For example, the output terminal OUT outputs an RF signal. The power amplifier circuit 1 amplifies, for example, the power of a high-frequency signal in the RF band. The power amplifier circuit 1 according to the first embodiment is mounted in, for example, a wireless communication terminal supporting RF communication, such as in the Sub-6 band for the fifth-generation mobile communication system or in the 5 GHz band for WiFi.

The input-stage power amplifier 11 is a power amplifier in the input stage. The output-stage power amplifier 12 is a power amplifier in the output stage. The intermediate-stage power amplifier 1M is disposed between the input-stage power amplifier 11 and the output-stage power amplifier 12.

The power amplifier circuit 1 according to this embodiment is a power amplifier circuit having a three-stage configuration including the input-stage power amplifier 11, the intermediate-stage power amplifier 1M, and the output-stage power amplifier 12.

A first matching circuit MN1 is disposed between the input terminal IN and the input-stage power amplifier 11. The first matching circuit MN1 performs impedance matching between a circuit preceding the input terminal IN and the input-stage power amplifier 11.

A second matching circuit MNa is disposed between the input-stage power amplifier 11 and the intermediate-stage power amplifier 1M. The second matching circuit MNa performs impedance matching between the input-stage power amplifier 11 and the intermediate-stage power amplifier 1M.

A third matching circuit MNb is disposed between the intermediate-stage power amplifier 1M and the output-stage power amplifier 12. The third matching circuit MNb performs impedance matching between the intermediate-stage power amplifier 1M and the output-stage power amplifier 12.

A fourth matching circuit MN2 is disposed between the output-stage power amplifier 12 and the output terminal OUT. The fourth matching circuit MN2 performs impedance matching between the output-stage power amplifier 12 and a circuit subsequent to the output terminal OUT.

The input-stage power amplifier 11 includes a transistor Q21 and a capacitor C11. The intermediate-stage power amplifier 1M includes transistors Q1M and Q2M and capacitors C1M and C30. The output-stage power amplifier 12 includes a transistor Q22 and a capacitor C12.

Example Configuration of Input-Stage Power Amplifier

Figure 2:
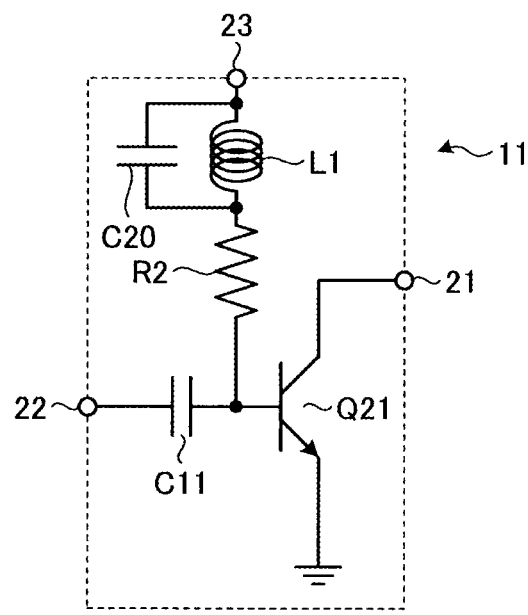
FIG. 2 illustrates an example configuration of an input-stage power amplifier.

FIG. 2 illustrates an example configuration of the input-stage power amplifier 11. In FIG. 2, the input-stage power amplifier 11 includes the transistor Q21, capacitors C11 and C20, an inductor L1, and a resistance element R2. Non-limiting examples of the transistor Q21 include an NPN-type transistor.

In the present disclosure, each transistor is a bipolar transistor, for example but not limitation. A bipolar transistor has an emitter, a collector, and a base corresponding to a first terminal, a second terminal, and a third terminal, respectively. Non-limiting examples of the bipolar transistor include a heterojunction bipolar transistor (HBT). Each transistor may be a field-effect transistor (FET), for example. In this case, the emitter may be read as "source", the collector may be read as "drain", and the base may be read as "gate". Accordingly, the first terminal may be referred to as "emitter" or "source", the second terminal may be referred to as "collector" or "drain", and the third terminal may be referred to as "base" or "gate". Each transistor may be a multi-finger transistor having a plurality of unit transistors (also referred to as fingers) electrically connected in parallel with each other. The term "unit transistor" refers to a minimum element of a transistor.

The collector of the transistor Q21 is connected to a node 21. The emitter of the transistor Q21 is connected to a reference potential. Non-limiting examples of the reference potential include ground potential. An input signal is supplied to a node 22. The capacitor C11 functions as a direct-current (DC) cut capacitor. An input signal passing through the capacitor C11 is supplied to the base of the transistor Q21.

A bias (i.e., a bias current or a bias voltage) is applied to a node 23. The capacitor C20 and the inductor L1 function as a filter. The resistance element R2 functions as a bias resistor for providing a bias to the base of the transistor Q21. The capacitor C20 and the inductor L1 are optional and may be omitted.

Example Configuration of Intermediate-Stage Power Amplifier

Figure 3:
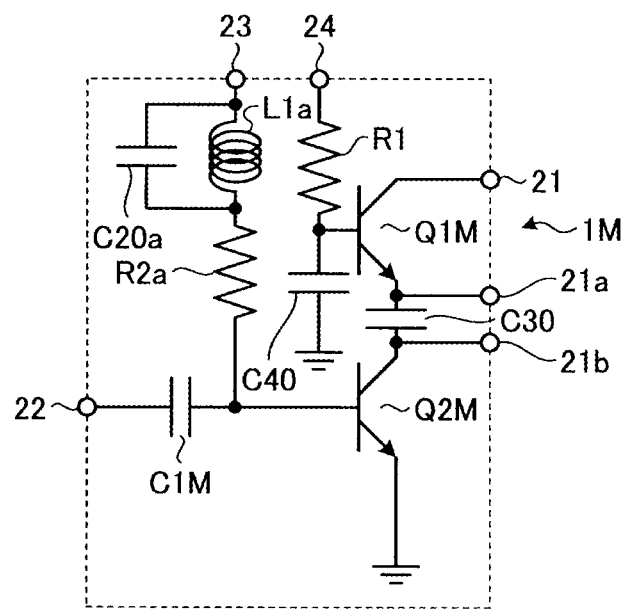
FIG. 3 illustrates an example configuration of an intermediate-stage power amplifier.

FIG. 3 illustrates an example configuration of the intermediate-stage power amplifier 1M. In FIG. 3, the intermediate-stage power amplifier 1M includes the transistors Q1M and Q2M, capacitors C1M, C20$a$, C30, and C40, an inductor L1$a$, and resistance elements R1 and R2$a$. The intermediate-stage power amplifier 1M further includes nodes 21, 21$a$, 21$b$, 22, 23, and 24. The collector of the transistor Q1M is electrically connected to the node 21. The emitter of the transistor Q1M and an end of the capacitor C30 are electrically connected to the node 21$a$. The collector of the transistor Q2M and the other end of the capacitor C30 are electrically connected to the node 21$b$.

The input-stage power amplifier 11 described with reference to FIG. 2 is constituted by a single transistor, whereas the intermediate-stage power amplifier 1M includes the two transistors Q1M and Q2M. In this embodiment, the emitter of the transistor Q1M, which is a first transistor, and the collector of the transistor Q2M, which is a second transistor, are connected to each other via the capacitor C30 (this configuration is hereinafter referred to as AC stack configuration, when necessary). That is, an end of the capacitor C30 is electrically connected to the emitter of the transistor Q1M, and the other end of the capacitor C30 is electrically connected to the collector of the transistor Q2M. The capacitor C30 isolates the transistor Q1M and the transistor Q2M from each other for DC and couples the transistor Q1M and the transistor Q2M to each other for alternating current (AC). A power supply voltage is input to the node 21 and is input to the collector of the transistor Q1M. The node 21$a$ is connected to a reference potential, and the emitter of the transistor Q2M is connected to a reference potential. The node 21$b$ is connected to a power supply voltage, and the power supply voltage is input to the collector of the transistor Q2M. An input signal is supplied to the node 22. An output signal is output from the node 21. Non-limiting examples of the transistors Q1M and Q2M include NPN-type transistors.

A bias is applied to the nodes 23 and 24. The capacitor C20$a$ and the inductor L1$a$ function as a filter. The resistance element R2$a$ functions as a bias resistor for applying a bias to the base of the transistor Q2M. The resistance element R1 functions as a bias resistor for applying a bias to the base of the transistor Q1M. The capacitor C20$a$ and the inductor L1$a$ are optional and may be omitted.

Example Configuration of Output-Stage Power Amplifier

Figure 4:
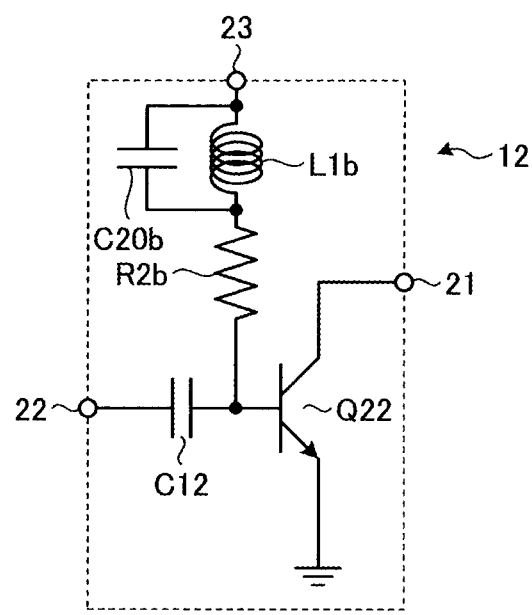
FIG. 4 illustrates an example configuration of an output-stage power amplifier.

FIG. 4 illustrates an example configuration of the output-stage power amplifier 12. In FIG. 4, the output-stage power amplifier 12 includes the transistor Q22, capacitors C12 and C20$b$, an inductor L1$b$, and a resistance element R2$b$. Non-limiting examples of the transistor Q22 include an NPN-type transistor.

The collector of the transistor Q22 is connected to a node 21. The emitter of the transistor Q22 is connected to a reference potential. Non-limiting examples of the reference potential include ground potential. An input signal is supplied to a node 22. The capacitor C12 functions as a DC cut capacitor. An input signal passing through the capacitor C12 is supplied to the base of the transistor Q22.

A bias is applied to a node 23. The capacitor C20$b$ and the inductor L1$b$ function as a filter. The resistance element R2$b$ functions as a bias resistor for applying a bias to the base of the transistor Q22.

AC Stack Configuration

An advantage of a power amplifier having an AC stack configuration will now be described. In a power amplifier having an AC stack configuration, the impedance of a load can be doubled. That is, even if the impedance of the load is doubled, the desired operation can be maintained. In a power amplifier having a single transistor instead of an AC stack configuration, if the impedance of a load is doubled, the voltage fluctuation is also doubled, which may make it difficult to operate the power amplifier due to insufficient power supply voltage. In a power amplifier having an AC stack configuration, in contrast, two transistors with a capacitor interposed therebetween operate, thereby operating the power amplifier without necessarily doubling the power supply voltage even if the impedance of a load is doubled.

Next, an advantage of the intermediate-stage power amplifier 1M having an AC stack configuration will be described. In a power amplifier circuit including power amplifiers connected in a plurality of stages, it is suitable to increase the gain in any of the stages to compensate for an insufficient gain of the entire power amplifier circuit. It is assumed that the output-stage power amplifier 12 has an AC stack configuration to increase the gain in the output stage. In this case, since the output-stage power amplifier 12 is relatively larger in transistor size than any other stage, the use of an AC stack configuration leads to an increase in the area of the transistor. To avoid the increase in the area of the transistor, it may not be beneficial to use the AC stack configuration in the output-stage power amplifier 12.

It is assumed that the input-stage power amplifier 11 has an AC stack configuration to increase the gain in the input stage. In this case, the gain of the input-stage power amplifier 11 is excessively increased, which may cause a reduction in the linearity of amplification in the subsequent, intermediate-stage power amplifier 1M that receives an output signal of the input-stage power amplifier 11. In view of linearity, it may not be beneficial to use the AC stack configuration in the input-stage power amplifier 11. In a case where the intermediate-stage power amplifier 1M has an AC stack configuration, even if the gain of a signal to be input to the subsequent stage increases, the output of the output-stage power amplifier 12 exhibits linearity up to a high region. Thus, linearity is not reduced.

In one or more embodiments of the present disclosure, accordingly, the intermediate-stage power amplifier 1M, other than the input-stage power amplifier 11 and the output-stage power amplifier 12, has an AC stack configuration.

Next, the operation of the power amplifier circuit 1 according to the first embodiment will be described. In FIG. 1, the input-stage power amplifier 11 of the power amplifier circuit 1 receives an RF input signal, which is input to the input terminal IN, via the first matching circuit MN1. The intermediate-stage power amplifier 1M receives an output signal of the input-stage power amplifier 11 via the second matching circuit MNa. The output-stage power amplifier 12 receives an output signal of the intermediate-stage power amplifier 1M via the third matching circuit MNb. The output-stage power amplifier 12 outputs an amplified RF output signal to the output terminal OUT via the fourth matching circuit MN2. The power amplifier circuit 1 can provide low distortion and ensure sufficient gain without necessarily increasing the circuit size by using three stages of power amplifiers, namely, the input-stage power amplifier 11, the intermediate-stage power amplifier 1M, and the output-stage power amplifier 12, while performing impedance matching by using the first matching circuit MN1, the second matching circuit MNa, the third matching circuit MNb, and the fourth matching circuit MN2.

Advantages

The following describes advantages of the power amplifier circuit 1 according to the first embodiment. Prior to the description of the advantages, a comparative example will be described for easy understanding of the first embodiment.

Comparative Example

Figure 5:
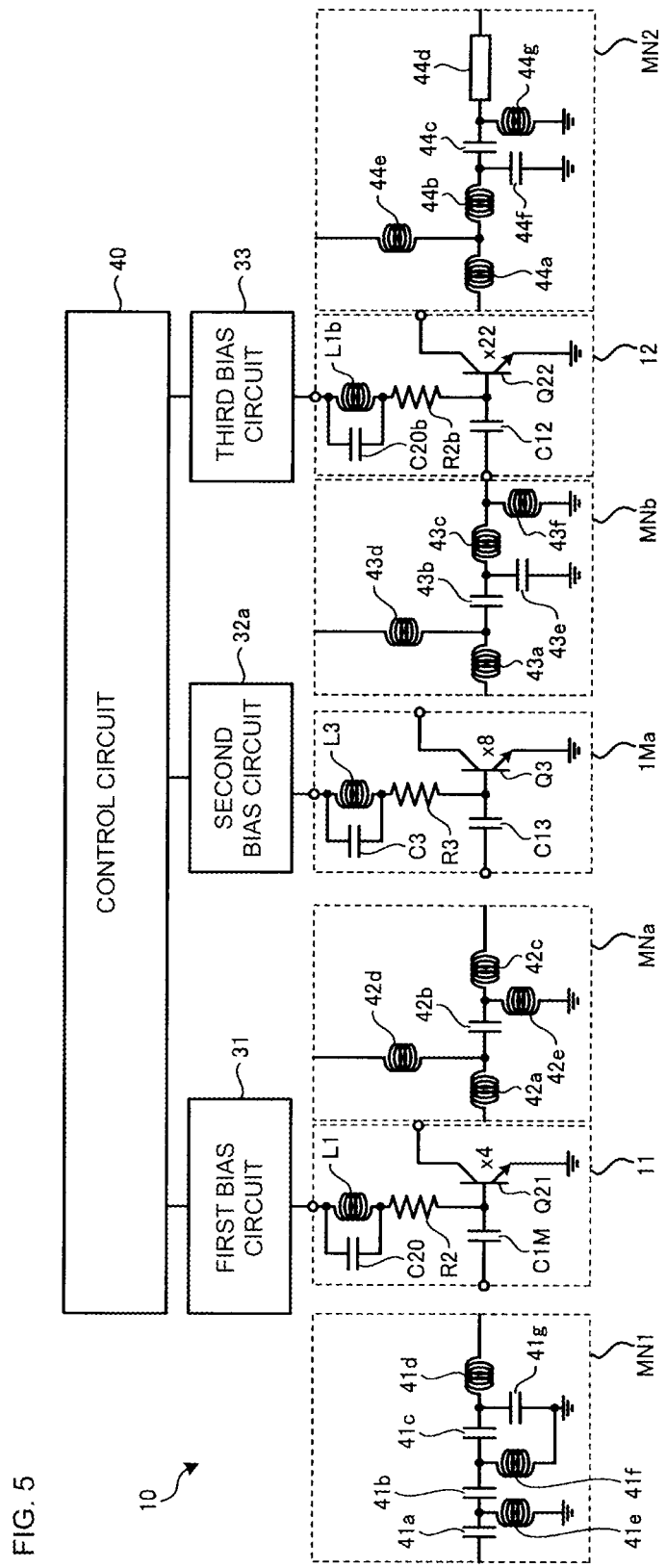
FIG. 5 illustrates a power amplifier circuit of a comparative example.

A power amplifier circuit of a comparative example will be described. FIG. 5 is a diagram illustrating a power amplifier circuit of a comparative example. FIG. 5 schematically illustrates a power amplifier circuit 10 of a comparative example. FIG. 6 illustrates the gains of the components of the power amplifier circuit 10 illustrated in FIG. 5.

The power amplifier circuit 10 illustrated in FIG. 5 includes a first matching circuit MN1, an input-stage power amplifier 11, a second matching circuit MNa, an intermediate-stage power amplifier 1Ma, a third matching circuit MNb, an output-stage power amplifier 12, and a fourth matching circuit MN2. The input-stage power amplifier 11, the intermediate-stage power amplifier 1Ma, and the output-stage power amplifier 12 of the power amplifier circuit 10 illustrated in FIG. 5 are each configured to include a single transistor.

The intermediate-stage power amplifier 1Ma includes a transistor Q3, capacitors C13 and C3, an inductor L3, and a resistance element R3. Non-limiting examples of the transistor Q3 include an NPN-type transistor.

In the input-stage power amplifier 11 illustrated in FIG. 5, the sign "×4" indicates a multi-finger transistor having four unit transistors electrically connected in parallel with each other. In the intermediate-stage power amplifier 1Ma illustrated in FIG. 5, the sign "×8" indicates a multi-finger transistor having eight unit transistors electrically connected in parallel with each other. In the output-stage power amplifier 12 illustrated in FIG. 5, the sign "×22" indicates a multi-finger transistor having 22 unit transistors electrically connected in parallel with each other.

In FIG. 5, the first matching circuit MN1 includes a capacitor 41a, a capacitor 41b, a capacitor 41c, and an inductor 41d that are connected in series. The first matching circuit MN1 further includes an inductor 41e having an end connected between the capacitor 41a and the capacitor 41b, an inductor 41f having an end connected between the capacitor 41b and the capacitor 41c, and a capacitor 41g having an end connected between the capacitor 41c and the inductor 41d. The other end of the inductor 41e, the other end of the inductor 41f, and the other end of the capacitor 41g are electrically connected to a reference potential.

The second matching circuit MNa includes an inductor 42a, a capacitor 42b, and an inductor 42c that are connected in series. The second matching circuit MNa further includes an inductor 42d having an end connected between the inductor 42a and the capacitor 42b and another end electrically connected to a predetermined potential, and an inductor 42e having an end connected between the capacitor 42b and the inductor 42c and another end electrically connected to a reference potential. The predetermined potential is assumed to be a potential required for impedance matching.

The third matching circuit MNb includes an inductor 43a, a capacitor 43b, and an inductor 43c that are connected in series. The third matching circuit MNb further includes an inductor 43d having an end connected between the inductor 43a and the capacitor 43b and another end electrically connected to a predetermined potential, a capacitor 43e having an end connected between the capacitor 43b and the inductor 43c and another end electrically connected to a reference potential, and an inductor 43f having an end connected to an end of the inductor 43c and another end electrically connected to a reference potential. The predetermined potential is assumed to be a potential required for impedance matching.

The fourth matching circuit MN2 includes an inductor 44a, an inductor 44b, a capacitor 44c, and a line 44d that are connected in series. The fourth matching circuit MN2 further includes an inductor 44e having an end connected between the inductor 44a and the inductor 44b, a capacitor 44f having an end connected between the inductor 44b and the capacitor 44c, and an inductor 44g having an end connected between the capacitor 44c and the line 44d. The other end of the inductor 44e is electrically connected to a predetermined potential. The predetermined potential is assumed to be a potential required for impedance matching. The other end of the capacitor 44f and the other end of the inductor 44g are electrically connected to a reference potential.

The power amplifier circuit 10 illustrated in FIG. 5 further includes a first bias circuit 31, a second bias circuit 32a, a third bias circuit 33, and a control circuit 40. The first bias circuit 31 outputs a bias to be applied to the input-stage power amplifier 11. The second bias circuit 32a outputs a bias to be applied to the intermediate-stage power amplifier 1Ma. The third bias circuit 33 outputs a bias to be applied to the output-stage power amplifier 12. The control circuit 40 controls the first bias circuit 31, the second bias circuit 32a, and the third bias circuit 33.

As illustrated in FIG. 6, for example, in the input-stage power amplifier 11, a gain of 15 dB is obtained.

In the intermediate-stage power amplifier 1Ma, a gain of 14 dB is obtained.

In the output-stage power amplifier 12, a gain of 12 dB is obtained.

In FIG. 6, the first matching circuit MN1 has a gain of, for example, −4 dB. The second matching circuit MNa has a gain of, for example, −4.5 dB. The third matching circuit MNb has a gain of, for example, −2.5 dB. The fourth matching circuit MN2 has a gain of −1.5 dB. From the results described above, the entire circuit configuration illustrated in FIG. 5 has a total gain of 28.5 dB.

Figure 7:
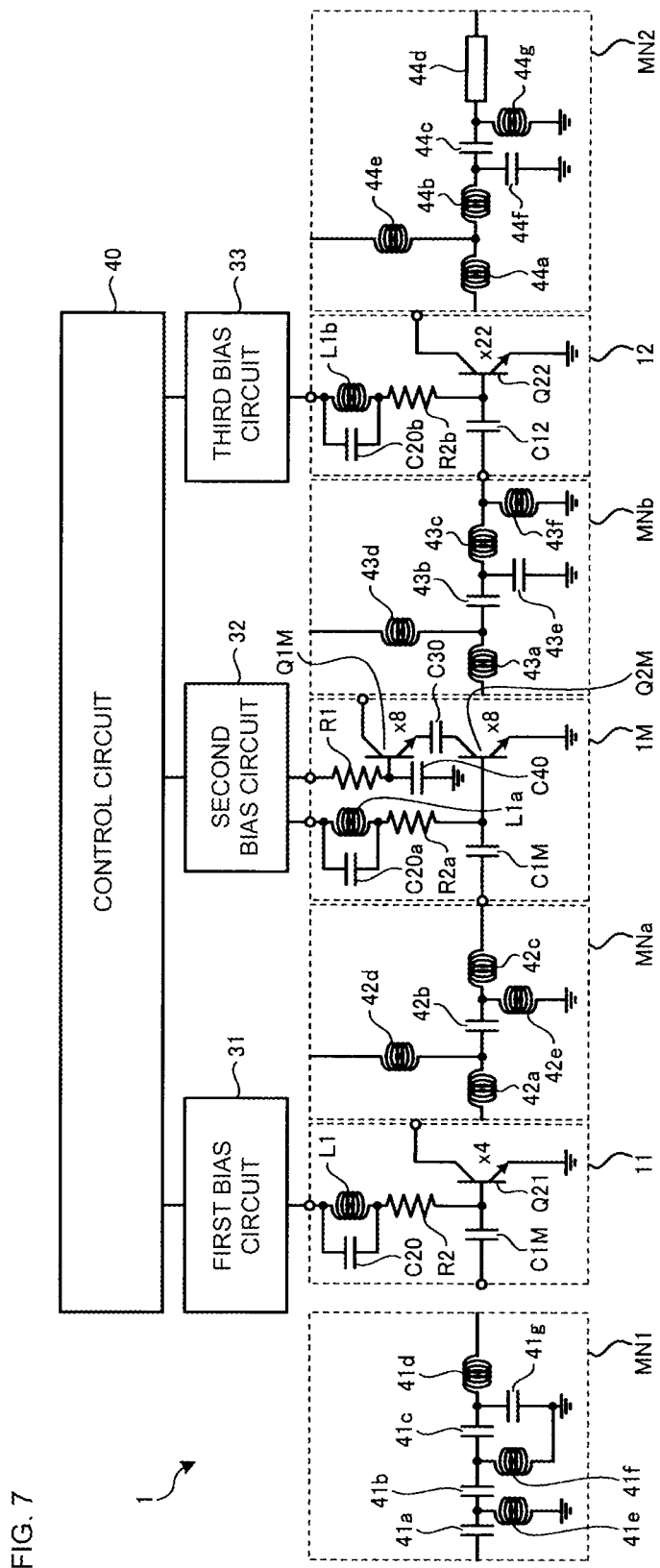
FIG. 7 illustrates the power amplifier circuit according to the first embodiment.

Next, the power amplifier circuit 1 according to the first embodiment will be described. FIG. 7 is a diagram illustrating the power amplifier circuit 1 according to the first embodiment. FIG. 7 schematically illustrates the power amplifier circuit 1 illustrated in FIG. 1.

The power amplifier circuit 1 illustrated in FIG. 7 includes the first matching circuit MN1, the input-stage power amplifier 11, the second matching circuit MNa, the intermediate-stage power amplifier 1M, the third matching circuit MNb, the output-stage power amplifier 12, and the fourth matching circuit MN2. The configuration of the first matching circuit MN1, the configuration of the second matching circuit MNa, the configuration of the third matching circuit MNb, and the configuration of the fourth matching circuit MN2 are illustrative and not in any way limiting.

The configuration of the intermediate-stage power amplifier 1M is different from that of the intermediate-stage power amplifier 1Ma in the power amplifier circuit 10 illustrated in FIG. 5. Specifically, the intermediate-stage power amplifier 1M in the power amplifier circuit 1 illustrated in FIG. 7 includes two transistors and has a configuration in which the emitter of the transistor Q1M, which is a first transistor, and the collector of the transistor Q2M, which is a second transistor, are connected to each other via the capacitor C30. That is, the intermediate-stage power amplifier 1M has an AC stack configuration. In contrast, the intermediate-stage power amplifier 1Ma in the power amplifier circuit 10 illustrated in FIG. 5 described above has a configuration including a single transistor. A second bias circuit 32 outputs a bias to be applied to the intermediate-stage power amplifier 1M.

FIG. 8 illustrates the gains of the components of the power amplifier circuit 1 illustrated in FIG. 7. In FIG. 8, in the input-stage power amplifier 11, as in FIG. 6, a gain of 15 dB is obtained. In FIG. 8, in the output-stage power amplifier 12, as in FIG. 6, a gain of 12 dB is obtained.

The intermediate-stage power amplifier 1M in the power amplifier circuit 1 illustrated in FIG. 7 has an AC stack configuration. The total size of the transistors of the intermediate-stage power amplifier 1M is assumed to be equal to the total size of the transistor of the intermediate-stage power amplifier 1Ma illustrated in FIG. 5. In this case, as illustrated in FIG. 8, in the intermediate-stage power amplifier 1M having an AC stack configuration, a gain of 18 dB, which is larger than the gain of the intermediate-stage power amplifier 1Ma illustrated in FIG. 6, is obtained.

In FIG. 8, the first matching circuit MN1, the second matching circuit MNa, the third matching circuit MNb, and the fourth matching circuit MN2 have gains similar to those illustrated in FIG. 6. Accordingly, the entire circuit configuration illustrated in FIG. 7 has a total gain of 32.5 dB. That is, since the intermediate-stage power amplifier 1M in the power amplifier circuit 1 illustrated in FIG. 7 has an AC stack configuration, in the power amplifier circuit 1 according to the first embodiment, a gain larger than that of the power amplifier circuit 10 of the comparative example is obtained.

Second Embodiment

Circuit Configuration

Figure 9:
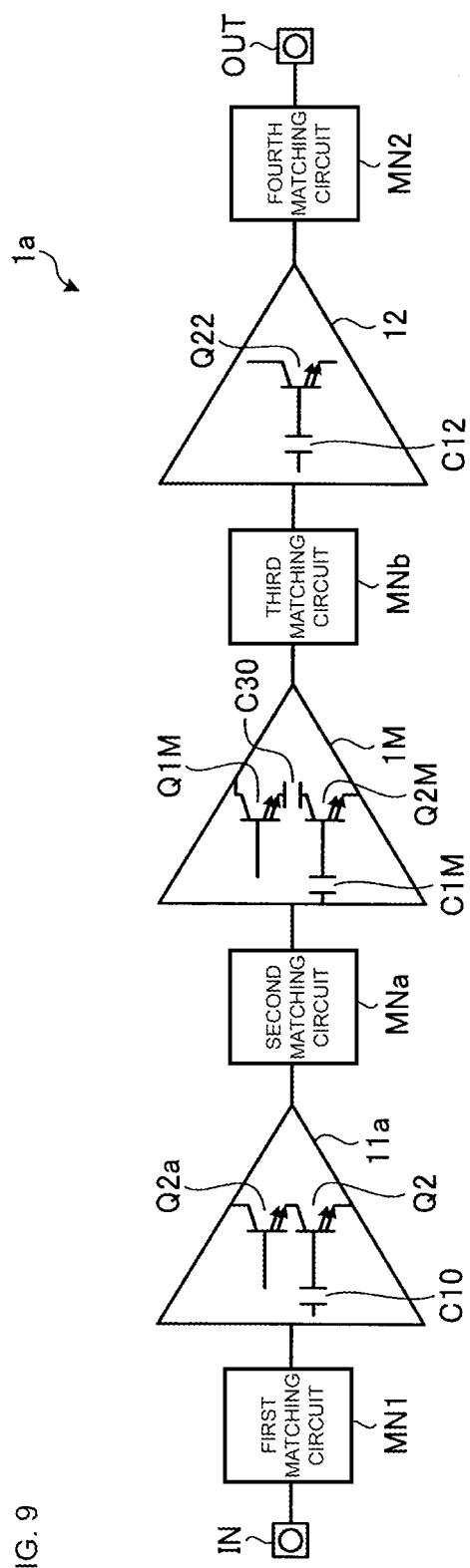
FIG. 9 is a circuit configuration of a power amplifier circuit according to a second embodiment.

FIG. 9 illustrates a circuit configuration of a power amplifier circuit 1a according to a second embodiment. In FIG. 9, the power amplifier circuit 1a includes an input terminal IN, an input-stage power amplifier 11a, an intermediate-stage power amplifier 1M, an output-stage power amplifier 12, and an output terminal OUT. The intermediate-stage power amplifier 1M has a configuration similar to the configuration described with reference to FIGS. 1 and 3. The input-stage power amplifier 11a has a configuration different from the configuration of the input-stage power amplifier 11 according to the first embodiment. The input-stage power amplifier 11a includes transistors Q2 and Q2a and a capacitor C10.

Example Configuration of Input-Stage Power Amplifier

Figure 10:
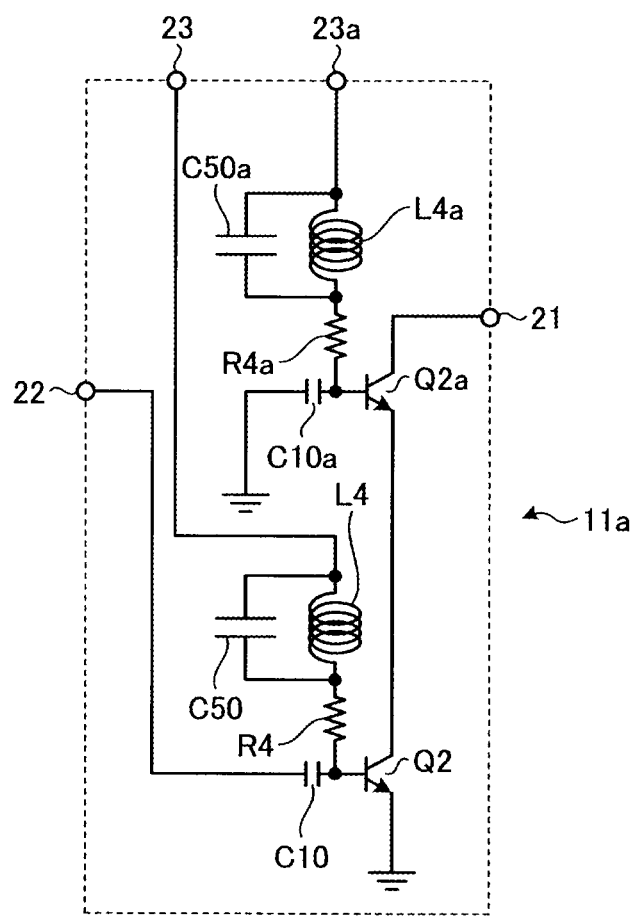
FIG. 10 illustrates an example configuration of an input-stage power amplifier illustrated in FIG. 9.

FIG. 10 illustrates an example configuration of the input-stage power amplifier 11a illustrated in FIG. 9. In FIG. 10, the input-stage power amplifier 11a has two configurations, each corresponding to the configuration of the input-stage power amplifier 11 described with reference to FIG. 2. The input-stage power amplifier 11a includes the transistor Q2, capacitors C10 and C50, an inductor L4, and a resistance element R4. The input-stage power amplifier 11a further includes the transistor Q2a, capacitors C10a and C50a, an inductor L4a, and a resistance element R4a. The transistor Q2a corresponds to a first transistor of the present disclosure. The transistor Q2 corresponds to a second transistor of the present disclosure. A node 21 is connected to a power supply voltage, and the power supply voltage is input to the collector of the transistor Q2a. A bias is applied to nodes 23 and 23a. A node 22, which is an input node, is connected to the base of the transistor Q2 via the capacitor C10. The capacitor C10 functions as a DC cut capacitor. The base of the transistor Q2a is connected to a reference potential via the capacitor C10a. The node 21, which is an output node, is connected to the collector of the transistor Q2a. An output signal is output from the node 21.

In the input-stage power amplifier 11a, the emitter of the transistor Q2a is electrically connected to the collector of the transistor Q2. The emitter of the transistor Q2a and the collector of the transistor Q2 are connected directly without necessarily the intervention of a capacitor, which is different from the intermediate-stage power amplifier 1M. In the following, a configuration in which the transistor Q2a and the transistor Q2 are connected vertically is referred to as a cascode connection configuration.

When a signal to be input to the input-stage power amplifier 11a has small power, the power fluctuation of a signal to be output is small. Accordingly, even with the use of a cascode connection configuration, the input-stage power amplifier 11a achieves amplification without necessarily saturation. Therefore, if a signal to be input to the input-stage power amplifier 11a has small power, it is beneficial to use a cascode connection configuration in the input-stage power amplifier 11a.

In the power amplifier circuit 1a illustrated in FIG. 9 including the input-stage power amplifier 11a illustrated in FIG. 10, as in the first embodiment, gain can be increased in the intermediate-stage power amplifier 1M having an AC stack configuration. In addition, gain can also be increased in the input-stage power amplifier 11a having a cascode connection configuration. Therefore, higher gain can be obtained in the entire power amplifier circuit 1a.

Third Embodiment

Figure 11:
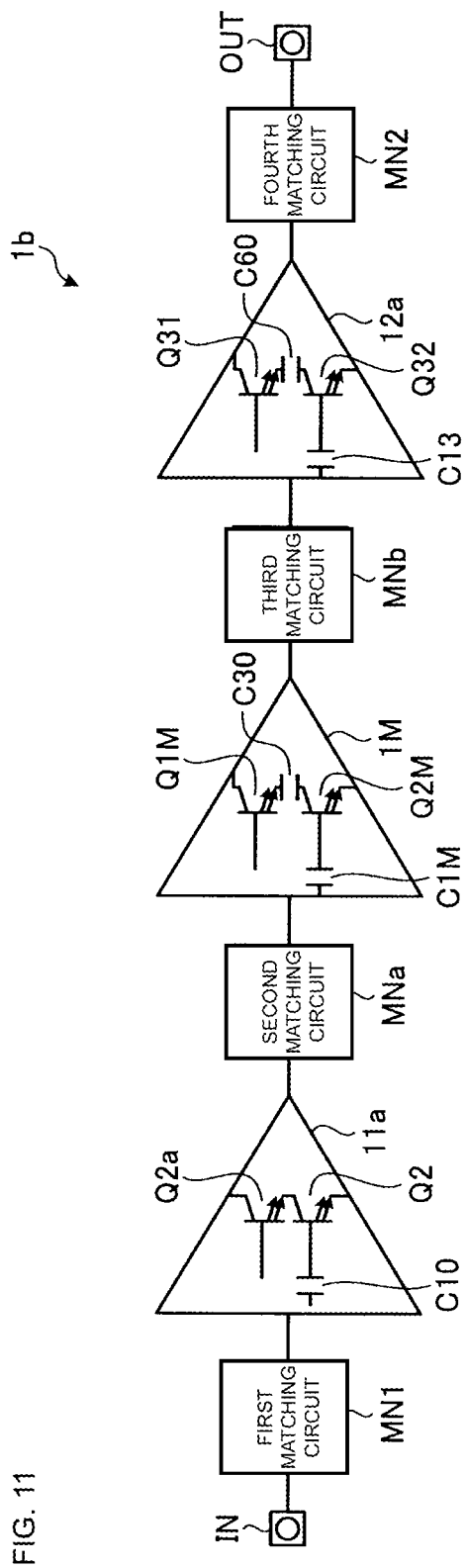
FIG. 11 is a circuit configuration of a power amplifier circuit according to a third embodiment.

FIG. 11 illustrates a circuit configuration of a power amplifier circuit 1b according to a third embodiment. In FIG. 11, the power amplifier circuit 1b according to the third embodiment includes an input-stage power amplifier 11a, an intermediate-stage power amplifier 1M, and an output-stage power amplifier 12a. The input-stage power amplifier 11a has a configuration similar to that described with reference to FIG. 10. The intermediate-stage power amplifier 1M has a configuration similar to that described with reference to FIG. 3. In the third embodiment, the output-stage power amplifier 12a also has an AC stack configuration, like the intermediate-stage power amplifier 1M. Specifically, the output-stage power amplifier 12a includes a transistor Q31, which is a first transistor, a transistor Q32, which is a second transistor, and a capacitor C60 having an end connected to the emitter of the transistor Q31 and another end connected to the collector of the transistor Q32. Since the output-stage power amplifier 12a has an AC stack configuration, higher gain can be obtained in the entire power amplifier circuit 1b.

Fourth Embodiment

Figure 12:
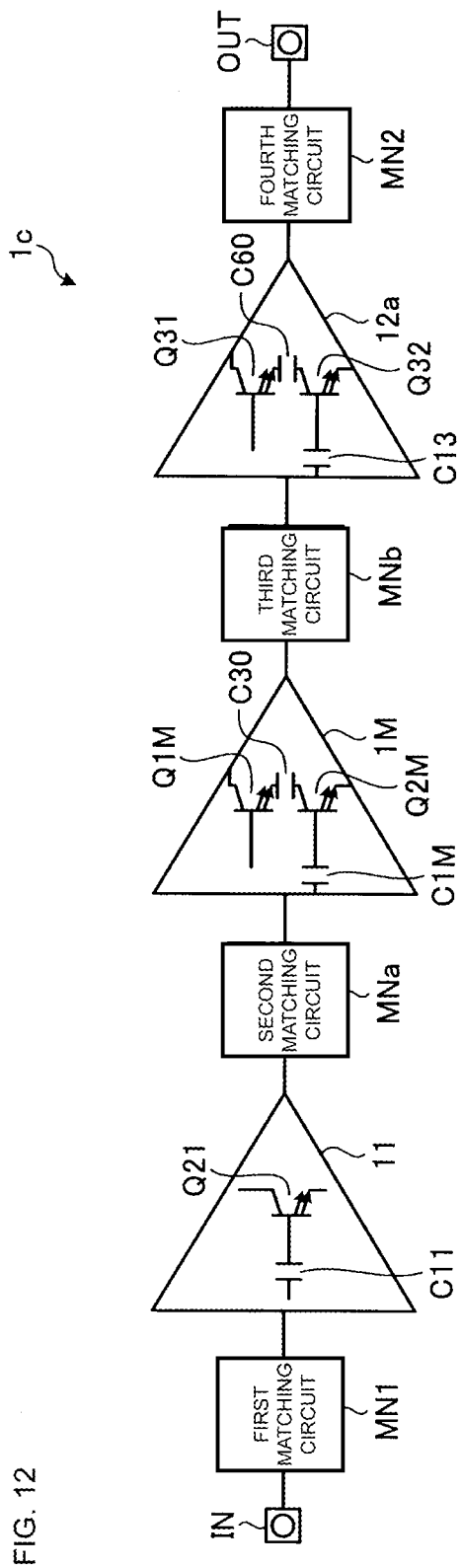
FIG. 12 is a circuit configuration of a power amplifier circuit according to a fourth embodiment.

FIG. 12 illustrates a circuit configuration of a power amplifier circuit 1c according to a fourth embodiment. In FIG. 12, the power amplifier circuit 1c according to the fourth embodiment includes an input-stage power amplifier 11, an intermediate-stage power amplifier 1M, and an output-stage power amplifier 12a. The input-stage power amplifier 11 has a configuration similar to that described with reference to FIG. 2. The intermediate-stage power amplifier 1M has a configuration similar to that described with reference to FIG. 3. In the fourth embodiment, the output-stage power amplifier 12a also has an AC stack configuration, like the intermediate-stage power amplifier 1M. Since the output-stage power amplifier 12a has an AC stack configuration, higher gain can be obtained in the entire power amplifier circuit 1c.

Modifications

The first to fourth embodiments described above illustrate a power amplifier circuit having amplifiers connected in three stages, namely, the input-stage power amplifier 11 or 11a, the intermediate-stage power amplifier 1M, and the output-stage power amplifier 12 or 12a. The number of stages of amplifiers is not limited to three. Specifically, amplifiers may be connected in four or more stages. In this case, an intermediate stage other than the input stage and the output stage includes the intermediate-stage power amplifier 1M having an AC stack configuration. When amplifiers are connected in four stages, the amplifier in the second or third stage is implemented as the intermediate-stage power amplifier 1M having an AC stack configuration. When amplifiers are connected in five stages, the amplifier in the second, third, or fourth stage is implemented as the intermediate-stage power amplifier 1M having an AC stack configuration.

In addition, in the first embodiment illustrated in FIG. 1, the input-stage power amplifier 11 may have an AC stack configuration. For example, in the fourth embodiment illustrated in FIG. 12, the input-stage power amplifier 11 may have an AC stack configuration. The AC stack configuration in the input stage can provide higher gain.

As described above, a power amplifier in at least an intermediate stage other than the input stage and the output stage has an AC stack configuration, thereby achieving a power amplifier circuit that provides low distortion and ensures sufficient gain without necessarily increasing the circuit size.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
an input-stage power amplifier configured to receive a radio-frequency input signal;
an output-stage power amplifier configured to output an amplified radio-frequency output signal; and
an intermediate-stage power amplifier between the input-stage power amplifier and the output-stage power amplifier,
wherein the intermediate-stage power amplifier comprises:
a first transistor,
a second transistor, and
a capacitor having a first end connected to a first terminal of the first transistor of the intermediate-stage power amplifier and a second end connected to a second terminal of the second transistor of the intermediate-stage power amplifier,
wherein the intermediate-stage power amplifier is configured to receive a signal at a third terminal of the second transistor of the intermediate-stage power amplifier, and to output an amplified signal from a second terminal of the first transistor of the intermediate-stage power amplifier, wherein the input-stage power amplifier comprises:
  a first transistor,
  a second transistor, and
  a direct-current cut capacitor connected to a third terminal of the second transistor of the input-stage power amplifier, wherein a first terminal of the first transistor of the input-stage power amplifier and a second terminal of the second transistor of the input-stage power amplifier are electrically connected to each other, wherein the input-stage power amplifier is configured to receive the input signal at the third terminal of the second transistor of the input-stage power amplifier via the direct-current cut capacitor, and wherein the input-stage power amplifier is configured to output an amplified signal from a second terminal of the first transistor of the input-stage power amplifier.

2. The power amplifier circuit according to claim 1, further comprising:
  a first matching circuit preceding the input-stage power amplifier, and configured to perform impedance matching;
  a second matching circuit between the input-stage power amplifier and the intermediate-stage power amplifier, and configured to perform impedance matching;
  a third matching circuit between the intermediate-stage power amplifier and the output-stage power amplifier, and configured to perform impedance matching; and
  a fourth matching circuit subsequent to the output-stage power amplifier, and configured to perform impedance matching.

3. The power amplifier circuit according to claim 1, wherein:
  the output-stage power amplifier comprises:
    a first transistor,
    a second transistor, and
    a capacitor having a first end connected to a first terminal of the first transistor of the output-stage power amplifier, and a second end connected to a second terminal of the second transistor of the output-stage power amplifier, and
  the output-stage power amplifier is configured to receive a signal at a third terminal of the second transistor of the output-stage power amplifier, and to output an amplified signal from a second terminal of the first transistor of the output-stage power amplifier.

4. The power amplifier circuit according to claim 2, wherein:
  the output-stage power amplifier comprises:
    a first transistor,
    a second transistor, and
    a capacitor having a first end connected to a first terminal of the first transistor of the output-stage power amplifier, and a second end connected to a second terminal of the second transistor of the output-stage power amplifier, and
  the output-stage power amplifier is configured to receive a signal at a third terminal of the second transistor of the output-stage power amplifier, and to output an amplified signal from a second terminal of the first transistor of the output-stage power amplifier.

5. The power amplifier circuit according to claim 1, wherein a gain of the intermediate-stage power amplifier is greater than a gain of the input-stage power amplifier, and is greater than a gain of the output-stage power amplifier.

6. The power amplifier circuit according to claim 2, wherein a gain of the intermediate-stage power amplifier is greater than a gain of the input-stage power amplifier, and is greater than a gain of the output-stage power amplifier.

7. The power amplifier circuit according to claim 1, further comprising:
  a plurality of bias circuits, each of the plurality of bias circuits being configured to output a bias to a corresponding one of the input-stage power amplifier, the intermediate-stage power amplifier, and the output-stage power amplifier.

8. The power amplifier circuit according to claim 2, further comprising:
  a plurality of bias circuits, each of the plurality of bias circuits being configured to output a bias to a corresponding one of the input-stage power amplifier, the intermediate-stage power amplifier, and the output-stage power amplifier.

9. The power amplifier circuit according to claim 1, wherein the first terminal of the first transistor of the intermediate-stage power amplifier is an emitter of the first transistor of the intermediate-stage power amplifier, the second terminal of the second transistor of the intermediate-stage power amplifier is a collector of the second transistor of the intermediate-stage power amplifier, the third terminal of the second transistor of the intermediate-stage power amplifier is a base of the second transistor of the intermediate-stage power amplifier, and the second terminal of the first transistor of the intermediate-stage power amplifier is a collector of the first transistor of the intermediate-stage power amplifier.

* * * * *